United States Patent
Tang et al.

(10) Patent No.: US 9,460,803 B1
(45) Date of Patent: Oct. 4, 2016

(54) DATA PATH WITH CLOCK-DATA TRACKING

(71) Applicant: MICRON TECHNOLOGY, INC., Boise, ID (US)

(72) Inventors: Qiang Tang, Cupertino, CA (US); Ali Feiz Zarrin Ghalam, Sunnyvale, CA (US); Hoon Choi, Santa Clara, CA (US); Eric N. Lee, San Jose, CA (US); Ramin Ghodsi, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/864,990

(22) Filed: Sep. 25, 2015

(51) Int. Cl.
| | |
|---|---|
| G11C 16/26 | (2006.01) |
| G11C 7/22 | (2006.01) |
| G11C 16/32 | (2006.01) |
| G11C 7/10 | (2006.01) |
| G11C 16/04 | (2006.01) |

(52) U.S. Cl.
CPC ............... *G11C 16/26* (2013.01); *G11C 7/106* (2013.01); *G11C 7/1057* (2013.01); *G11C 7/222* (2013.01); *G11C 16/0483* (2013.01); *G11C 16/32* (2013.01)

(58) Field of Classification Search
CPC ....... G11C 16/26; G11C 7/222; G11C 16/32; G11C 16/0483; G11C 7/106; G11C 7/1057
See application file for complete search history.

(56) References Cited

U.S. PATENT DOCUMENTS

| | | | | | |
|---|---|---|---|---|---|
| 5,432,823 | A | * | 7/1995 | Gasbarro | G06F 1/10 370/507 |
| 5,987,576 | A | * | 11/1999 | Johnson | G11C 7/22 711/100 |
| 7,370,168 | B2 | * | 5/2008 | Kanamori | G11C 29/02 711/167 |
| 2008/0298143 | A1 | * | 12/2008 | Chen | G11C 7/22 365/194 |
| 2014/0215294 | A1 | * | 7/2014 | Kim | G11C 17/02 714/819 |
| 2015/0348605 | A1 | * | 12/2015 | Jang | G11C 7/22 365/230.02 |

* cited by examiner

*Primary Examiner* — Han Yang
*Assistant Examiner* — Ajay Ojha
(74) *Attorney, Agent, or Firm* — Dicke, Billig & Czaja, PLLC

(57) ABSTRACT

A system includes a plurality of sensing devices, a first multiplexer, a plurality of local return clock signal paths, a second multiplexer, and a data latch. Each sensing device outputs data onto a respective local data path in response to a clock signal on a clock signal path. The first multiplexor passes data from a selected local data path to a global data path. Each local return clock signal path is coupled to the clock signal path at a respective sensing device such that each local return clock signal path is routed along with a respective local data path. The second multiplexor passes a return clock signal from a selected local return clock signal path corresponding to the selected local data path to a global return clock signal path. The data latch latches the data on the global data path into the data latch in response to the return clock signal on the global return clock signal path.

23 Claims, 8 Drawing Sheets

US 9,460,803 B1

DATA PATH WITH CLOCK-DATA TRACKING

TECHNICAL FIELD

The present disclosure relates generally to signal timing in integrated circuit devices, in particular, in one or more embodiments, the present disclosure relates to a wave pipeline data path with clock-data tracking in a memory device.

BACKGROUND

Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the memory cells, through programming (which is often referred to as writing) of charge storage structures (e.g., floating gates or charge traps) or other physical phenomena (e.g., phase change or polarization), determine the data value of each cell. Common uses for flash memory include personal computers, tablet computers, digital cameras, digital media players, cellular telephones, solid state drives and removable memory modules, and the uses are growing.

Typically when data is read from a memory, separate delays are used to match the timing between the data and the clock used to latch the data just prior to output to a device requesting the data. Process, voltage, and temperature (PVT) variations and the location within the memory from which the data is retrieved may cause delay mismatches between the data and the clock. These delay mismatches between the data and the clock may reduce the timing margin when latching the data just prior to output.

For the reasons stated above, and for other reasons stated below which will become apparent to those skilled in the art upon reading and understanding the present specification, there is a need in the art for alternative methods for clock-data tracking, and system and apparatus to perform such methods.

DETAILED DESCRIPTION

Figure 1:
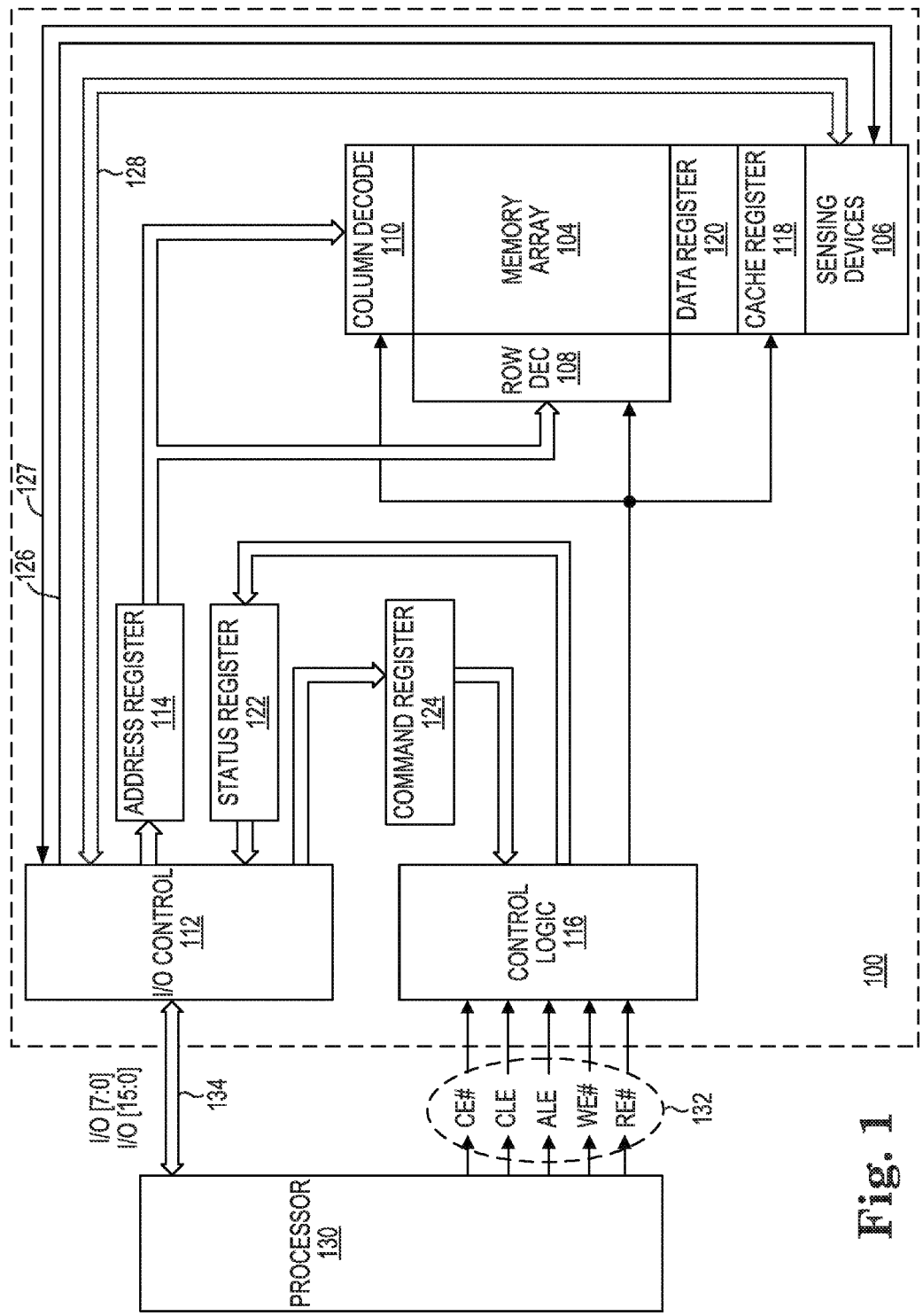
FIG. 1 is a simplified block diagram of one embodiment of a memory device in communication with a processor as part of an electronic system.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

A typical wave pipeline data path for outputting data from a memory may use a configurable delay for the clock to attempt to match the delay of the data and to shift the clock edge to provide an acceptable setup and hold time margin at a first in first out (FIFO) circuit used to latch the data just prior to output. Process, voltage, and temperature (PVT) variations and varying data delays, however, limit the setup and hold time margin that may be achieved using the configurable clock delay. Accordingly, this disclosure describes embodiments for facilitating an improved setup and hold time margin when reading data out of a memory.

FIG. 1 is a simplified block diagram of a first apparatus, in the form of a memory device 100, in communication with a second apparatus, in the form of a processor 130, as part of a third apparatus, in the form of an electronic system, according to an embodiment. Some examples of electronic systems include personal computers, tablet computers, digital cameras, digital media players, digital recorders, games, appliances, vehicles, wireless devices, cellular telephones and the like. The processor 130, e.g., a controller external to the memory device 100, may be a memory controller or other external host device.

Memory device 100 includes clock-data tracking to facilitate an improved setup and hold time margin when reading data out of memory device 100. A clock signal path 126 is routed along with a data bus 128. A return clock signal path 127 is also routed along with the data bus 128. A clock signal on the clock signal path 126 may be used to trigger data out of the sensing devices 106 (e.g., sense amplifiers). A return clock signal on the return clock signal path 127 may be used to latch the data from the sensing devices 106 into a data latch (e.g., FIFO) of input/output (I/O) control circuitry 112 just prior to outputting the data to processor 130. Since the clock signal and return clock signal are routed along with the data and may be subjected to the same logic circuitry and PVT variations as the data, the setup and hold time margin at the data latch may be improved. It will be recognized that process variations typically experienced in fabrication will generally lead to variations in performance of circuits, even where those circuits are intended to be of the same design or otherwise provide the same functionality. Similarly, even small separations of circuits may expose those circuits to differing voltage and temperature values if measured to sufficient precision. Thus, while this disclosure seeks to mitigate the effects of such variations between clock signal paths and data paths, there is no expectation that such variations are necessarily eliminated.

Memory device 100 includes an array of memory cells 104 logically arranged in rows and columns. Memory cells of a logical row are typically coupled to the same access line (commonly referred to as a word line) while memory cells of a logical column are typically selectively coupled to the same data line (commonly referred to as a bit line). A single access line may be associated with more than one logical row of memory cells and a single data line may be associated with more than one logical column. Memory cells (not shown in FIG. 1) of at least a portion of array of memory cells 104 are capable of being programmed to one of at least two data states.

A row decode circuitry 108 and a column decode circuitry 110 are provided to decode address signals. Address signals are received and decoded to access the array of memory cells 104. Memory device 100 also includes I/O control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

An internal controller (e.g., control logic 116) controls access to the array of memory cells 104 in response to the commands and generates status information for the external processor 130, i.e., control logic 116 is configured to perform access operations in accordance with embodiments described herein. The control logic 116 is in communication with row decode circuitry 108 and column decode circuitry 110 to control the row decode circuitry 108 and column decode circuitry 110 in response to the addresses.

Control logic 116 is also in communication with a cache register 118. Cache register 118 latches data, either incoming or outgoing, as directed by control logic 116 to temporarily store data while the array of memory cells 104 is busy writing or reading, respectively, other data. During a program operation (e.g., write operation), data is passed from sensing devices 106 to the cache register 118. The data is then passed from the cache register 118 to data register 120 for transfer to the array of memory cells 104; then new data is latched in the cache register 118 from sensing devices 106, which receive the new data from the I/O control circuitry 112. During a read operation, data is passed from the cache register 118 to sensing devices 106, which pass the data to the I/O control circuitry 112 for output to the external processor 130; then new data is passed from the data register 120 to the cache register 118. A status register 122 is in communication with I/O control circuitry 112 and control logic 116 to latch the status information for output to the processor 130.

Memory device 100 receives control signals at control logic 116 from processor 130 over a control link 132. The control signals may include at least a chip enable CE#, a command latch enable CLE, an address latch enable ALE, a write enable WE#, and a read enable RE#. Additional control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118 through sensing devices 106. The data are subsequently written into data register 120 for programming the array of memory cells 104. For another embodiment, cache register 118 may be omitted, and the data are written directly into data register 120 through sensing devices 106. Data are also output over input/output (I/O) pins [7:0] for an 8-bit device or input/output (I/O) pins [15:0] for a 16-bit device.

It will be appreciated by those skilled in the art that additional circuitry and signals can be provided, and that the memory device of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins may be used in the various embodiments.

Figure 2:
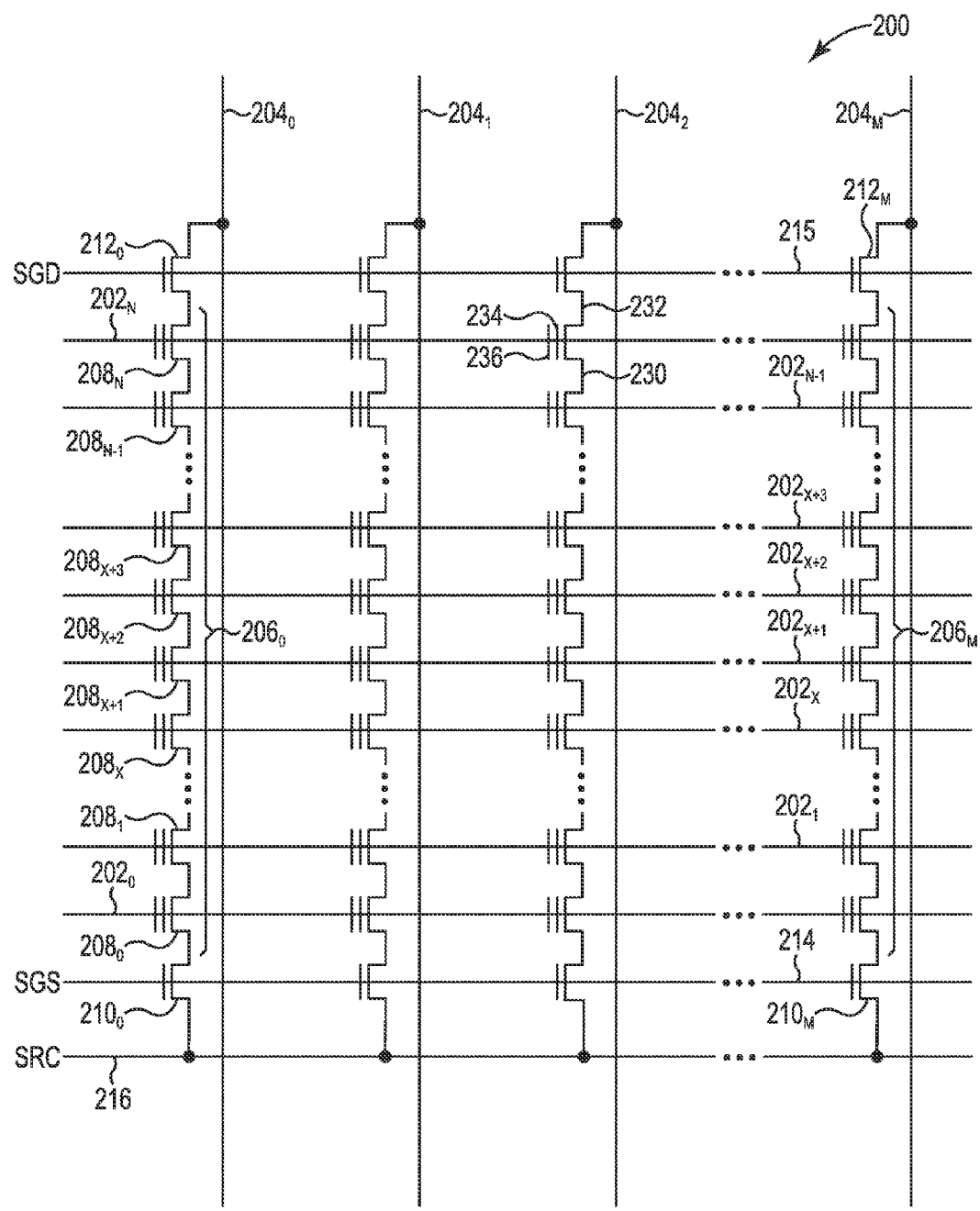
FIG. 2 is a schematic diagram of a portion of an array of memory cells as could be used in a memory device of the type described with reference to FIG. 1.

FIG. 2 is a schematic of a NAND memory array 200, e.g., as a portion of array of memory cells 104. Memory array 200 includes access lines, such as word lines $202_0$ to $202_N$, and data lines, such as bit lines $204_0$ to $204_M$. The word lines 202 may be coupled to global access lines (e.g., global word lines), not shown in FIG. 2, in a many-to-one relationship. For some embodiments, memory array 200 may be formed over a semiconductor that, for example, may be conductively doped to have a conductivity type, such as a p-type conductivity, e.g., to form a p-well, or an n-type conductivity, e.g., to form an n-well.

Memory array 200 might be arranged in rows (each corresponding to a word line 202) and columns (each corresponding to a bit line 204). Each column may include a string of series-coupled memory cells, such as one of NAND strings $206_0$ to $206_M$. Each NAND string 206 might be coupled to a common source 216 and might include memory cells $208_0$ to $208_N$. The memory cells 208 represent non-volatile memory cells for storage of data. The memory cells 208 of each NAND string 206 might be connected in series between a select transistor 210 (e.g., a field-effect transistor), such as one of the select transistors $210_0$ to $210_M$ (e.g., that may be source select transistors, commonly referred to as select gate source), and a select transistor 212 (e.g., a field-effect transistor), such as one of the select transistors $212_0$ to $212_M$ (e.g., that may be drain select transistors, commonly referred to as select gate drain).

Select transistors $210_0$ to $210_M$ might be commonly coupled to a select line 214, such as a source select line, and select transistors $212_0$ to $212_M$ might be commonly coupled to a select line 215, such as a drain select line.

A source of each select transistor 210 might be connected to common source 216. The drain of each select transistor 210 might be connected to the source of a memory cell $208_0$ of the corresponding NAND string 206. For example, the drain of select transistor $210_0$ might be connected to the source of memory cell $208_0$ of the corresponding NAND string $206_0$. Therefore, each select transistor 210 might be configured to selectively couple a corresponding NAND string 206 to common source 216. A control gate of each select transistor 210 might be connected to select line 214.

The drain of each select transistor 212 might be connected to the bit line 204 for the corresponding NAND string 206. For example, the drain of select transistor $212_0$ might be connected to the bit line $204_0$ for the corresponding NAND string $206_0$. The source of each select transistor 212 might be connected to the drain of a memory cell $208_N$ of the corresponding NAND string 206. For example, the source of select transistor $212_0$ might be connected to the drain of memory cell $208_N$ of the corresponding NAND string $206_0$. Therefore, each select transistor 212 might be configured to selectively couple a corresponding NAND string 206 to a corresponding bit line 204. A control gate of each select transistor 212 might be connected to select line 215.

The memory array in FIG. 2 might be a quasi-two-dimensional memory array and might have a generally planar structure, e.g., where the common source 216, strings 206 and bit lines 204 extend in substantially parallel planes. Alternatively, the memory array in FIG. 2 might be a three-dimensional memory array, e.g., where strings 206 may extend substantially perpendicular to a plane containing the common source 216 and to a plane containing the bit lines 204 that may be substantially parallel to the plane containing the common source 216.

Typical construction of memory cells 208 includes a data-storage structure 234 (e.g., a floating gate, charge trap, etc.) that can determine a data value of the cell (e.g., through changes in threshold voltage), and a control gate 236, as shown in FIG. 2. Memory cells 208 may further have a defined source 230 and a defined drain 232. Memory cells 208 have their control gates 236 coupled to (and in some cases form) a word line 202.

A column of the memory cells 208 is a NAND string 206 or a plurality of NAND strings 206 coupled to a given bit line 204. A row of the memory cells 208 are memory cells 208 commonly coupled to a given word line 202. A row of memory cells 208 can, but need not include all memory cells 208 commonly coupled to a given word line 202. Rows of memory cells 208 may often be divided into one or more groups of physical pages of memory cells 208, and physical pages of memory cells 208 often include every other memory cell 208 commonly coupled to a given word line 202. For example, memory cells 208 commonly coupled to word line $202_N$ and selectively coupled to even bit lines 204 (e.g., bit lines $204_0$, $204_2$, $204_4$, etc.) may be one physical page of memory cells 208 (e.g., even memory cells) while memory cells 208 commonly coupled to word line $202_N$ and selectively coupled to odd bit lines 204 (e.g., bit lines $204_1$, $204_3$, $204_5$, etc.) may be another physical page of memory cells 208 (e.g., odd memory cells). Although bit lines $204_3$-$204_5$ are not expressly depicted in FIG. 2, it is apparent from the figure that the bit lines 204 of the array of memory cells 200 may be numbered consecutively from bit line $204_0$ to bit line $204_M$. Other groupings of memory cells 208 commonly coupled to a given word line 202 may also define a physical page of memory cells 208. For certain memory devices, all memory cells commonly coupled to a given word line might be deemed a physical page. The portion of a physical page (which, in some embodiments, could still be the entire row) that is read during a single read operation or programmed during a program operation (e.g., an upper or lower page memory cells) might be deemed a logical page.

Although the example of FIG. 2 is discussed in conjunction with NAND flash, the embodiments described herein are not limited to a particular array architecture or structure, and can include other structures (e.g., cross-point memory, DRAM, etc.) and other architectures (e.g., AND arrays, NOR arrays, etc.).

Figure 3:
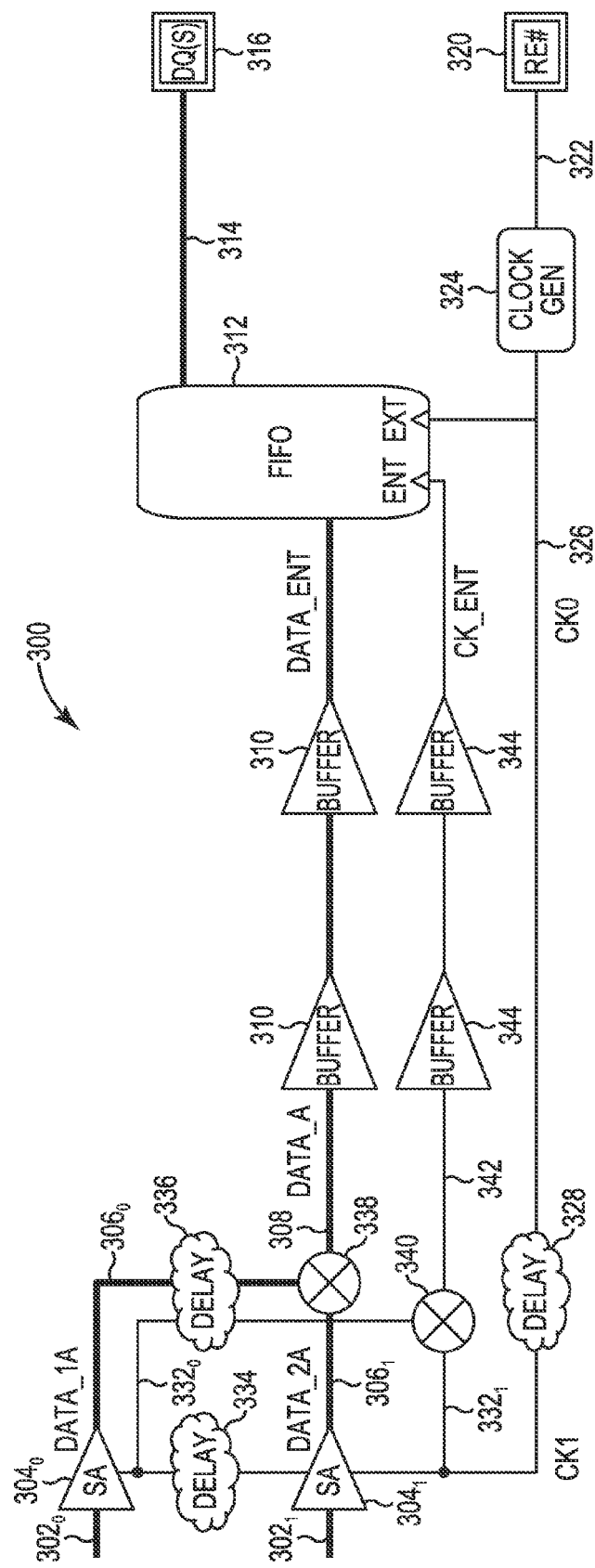
FIG. 3 is a schematic diagram illustrating one embodiment of a portion of an output data path.

FIG. 3 is a schematic diagram illustrating one embodiment of a portion of an output data path 300. In one example, the portion of the output data path 300 is a portion of the memory device 100 previously described and illustrated with reference to FIG. 1. The portion of the output data path 300 may include sense amplifiers $304_0$ and $304_1$, multiplexers 338 and 340, buffers 310 and 344, a FIFO 312, a clock generator 324, data node(s) (e.g., pad(s)) DQ(s) 316, and a read enable RE# clock signal node (e.g., pad) 320. While two sense amplifiers $304_0$ and $304_1$ are illustrated in FIG. 3, any suitable number of sense amplifiers may be included.

RE# clock signal pad 320 is electrically coupled to an input of clock generator 324 through a signal path 322. An output of clock generator 324 is electrically coupled to the exit clock input (EXT) of FIFO 312 and to the clock input of each sense amplifier $304_0$ and $304_1$ through a clock signal path 326. The data input of each sense amplifier $304_0$ and $304_1$ is communicatively coupled to the cache register 118 (FIG. 1) through a data path $302_0$ and $302_1$, respectively. The data output of each sense amplifier $304_0$ and $304_1$ is communicatively coupled to an input of multiplexor 338 through a local data path $306_0$ and $306_1$, respectively. The output of multiplexor 338 is communicatively coupled to the data input of FIFO 312 through a global data path 308. Global data path 308 may include one or more buffers 310.

Clock signal path 326 is electrically coupled to local return clock signal paths $332_0$ and $332_1$ at sense amplifiers $304_0$ and $304_1$, respectively. Each local return clock signal path $332_0$ and $332_1$ is electrically coupled to an input of multiplexer 340. The output of multiplexor 340 is electrically coupled to the entrance clock input (ENT) of FIFO 312 through a global return clock signal path 342. Global return clock signal path 342 may include one or more buffers 344 corresponding to the one or more buffers 310 of global data path 308. The data output of FIFO 312 is communicatively coupled to DQ(s) 316 through a data path 314. The data width of FIFO 312 equals the data width of global data path 308. FIFO 312 may have any suitable number of stages based on the particular configuration of the memory device.

In one example, DQ(s) 316 is a single data pad, and data paths $302_0$ and $302_1$, local data paths $306_0$ and $306_1$, and global data path 308 are corresponding single bit data paths. In other examples, DQ(s) 316 are multiple data pads (e.g., eight data pads), and data paths $302_0$ and $302_1$, local data paths $306_0$ and $306_1$, and global data path 308 are multiple bit parallel data paths. A serializer (not shown) may be included on data path 314 between FIFO 312 and each DQ 316 to serialize parallel data from FIFO 312 for output on DQ(s) 316. In this case, the data width of FIFO 312 and global data path 308 may be a multiple of the number of DQ(s) 316. For example, for four DQs 316 and an eight bit serializer for each DQ 316, the data width of FIFO 312 and global data path 308 is 32 bits for a double data rate (DDR) memory.

Clock generator 324 receives the RE# clock signal and generates a clock signal CK0 on clock signal path 326. In one example, clock generator 324 reduces the clock rate of the RE# clock signal so that the data throughput on global data path 308 is equal to the number of DQs 316. For example, for eight DQs 316 and a data width of 8×8=64 bits, clock generator 324 divides the RE# clock signal by four to provide clock signal CK0. The internal data bus is clocked by a single edge per cycle of the divided-down clock while the serializers and DQs are clocked by both edges per RE# clock cycle. The reduced clock rate for the internal data bus may be used to relax the internal timing requirements. The more reduced the internal clock rate, however, the wider the internal data bus generally needs to be to maintain the data throughput. Since a wider data bus may add layout cost and design complexity, however, there is a tradeoff between the data bus width and the internal clock rate.

Clock signal path 326 may include a delay 328 due to the routing and PVT variations of clock signal path 326 between clock generator 324 and sense amplifiers $304_0$ and $304_1$. As such, the clock single CK0 at the output of clock generator 324 may be delayed to provide a delayed clock signal CK1 at the clock input of sense amplifier $304_1$. The clock signal path 326 may include an additional delay 334 due to the routing and PVT variations of clock signal path 326 between sense amplifier $304_1$ and sense amplifier $304_0$. As such, the clock signal CK1 may be further delayed between sense amplifier $304_1$ and sense amplifier $304_0$.

Each local return clock signal path $332_0$ and $332_1$ is routed along with its corresponding local data path $306_0$ and $306_1$ such that both are subjected to substantially the same delay due to the routing and PVT variations. For example, local return clock signal path $332_0$ and local data path $306_0$ may include a delay 336 due to the routing and PVT variations of local return clock signal path $332_0$ and local data path $306_0$, respectively.

Each sense amplifier $304_0$ and $304_1$ provides DATA_1A and DATA_2A on local data paths $306_0$ and $306_1$, respectively, in response to the clock signal on clock signal path 326. Multiplexer 338 passes a selected one of DATA_1A from sense amplifier $304_0$ on local data path $306_0$ or DATA_2A from sense amplifier $304_1$ on local data path $306_1$ to provide DATA_A on global data path 308. Multiplexer 340 passes a selected one of a return clock signal on local return clock signal path $332_0$ from sense amplifier $304_0$ or a return clock signal on local return clock signal path $332_1$ from sense amplifier $304_1$ to provide the selected return clock signal on global return clock signal path 342. Multiplexer 340 passes the return clock signal corresponding to the data passed by multiplexer 338. Thus, both the return clock signal and the data are subjected to substantially the same delay due to multiplexers 338 and 340. The global return clock signal path 342 is routed along with the global data path 308 such that both are subjected to substantially the same delay due to the routing and PVT variations. The return clock signal at the ENT input of FIFO 312 (i.e., clock signal CK_ENT) triggers the latching of the data at the input of FIFO 312 (i.e., DATA_ENT) into FIFO 312. Clock signal CK0 clocks data out of FIFO 312 to DQ(s) 316.

Figure 4:
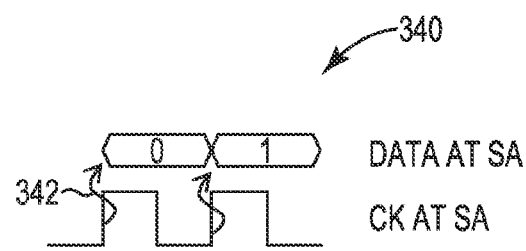
FIG. 4 is a timing diagram illustrating one embodiment of the triggering of data out of a sense amplifier of the output data path described with reference to FIG. 3.

FIG. 4 is a timing diagram 340 illustrating one embodiment of the triggering of data out of a sense amplifier of the portion of the output data path 300 described with reference to FIG. 3. Timing diagram 340 illustrates the data at a sense amplifier, such as sense amplifier $304_0$ or $304_1$, and the clock signal at the sense amplifier. As indicated at 342, the rising edge of the clock signal triggers the data out of the sense amplifier to provide the data on the respective local data path, such as local data path $306_0$ or $306_1$.

Figure 5:
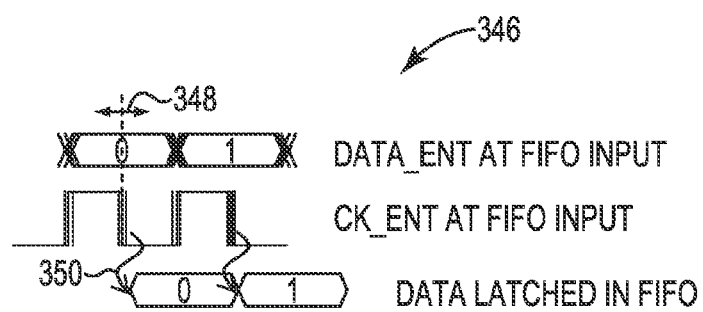
FIG. 5 is a timing diagram illustrating one embodiment of the latching of data into the FIFO of the output data path described with reference to FIG. 3.

FIG. 5 is a timing diagram 346 illustrating one embodiment of the latching of data into FIFO 312 of the portion of the output data path 300 described with reference to FIG. 3. Timing diagram 346 illustrates the DATA_ENT at the input of FIFO 312, the clock signal CK_ENT at the ENT input of FIFO 312, and the data latched in FIFO 312. The setup and hold time margin for the DATA_ENT at the data input of FIFO 312 is indicated at 348. As indicated at 350, the falling edge of CK_ENT latches the DATA_ENT into FIFO 312. By using the falling edge of CK_ENT to latch the data into FIFO 312, the maximum setup and hold time indicated at 348 is inherently provided since the falling edge of CK_ENT is automatically located at the center of the DATA_ENT eye opening. Thus, any timing window loss at the FIFO input due to the variation of the rising edge shift delay is eliminated.

Figure 6:
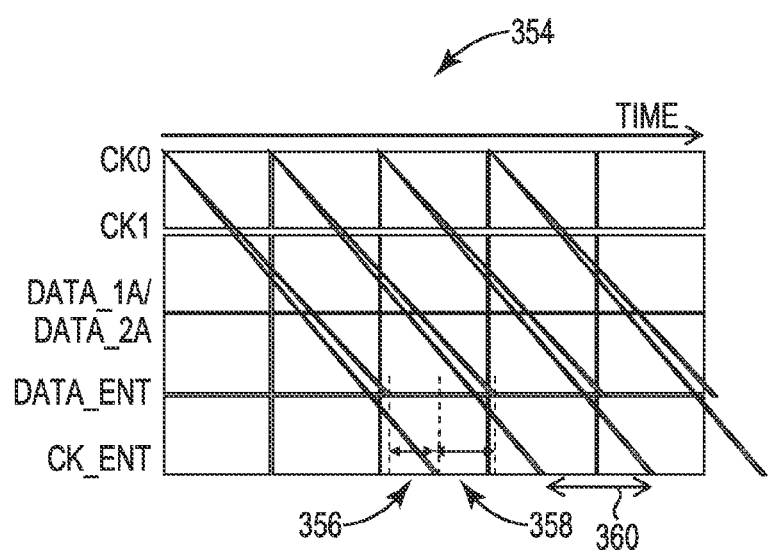
FIG. 6 is a timing diagram illustrating one embodiment of the wave pipeline timing of the output data path described with reference to FIG. 3.

FIG. 6 is a timing diagram 354 illustrating one embodiment of the wave pipeline timing of the portion of the output data path 300 described with reference to FIG. 3. A clock cycle is indicated at 360. In this example, the setup time margin is indicated at 356 and the hold time margin is indicated at 358. By routing the clock signal with the data, PVT variations that may cause delay mismatches and reduce the timing margin at the FIFO input may be substantially reduced or eliminated. The delay of data at the FIFO input also depends on the sense amplifier location, which may be significant for sense amplifiers with a large location spread. The effect of this delay, which can further reduce the timing margin at the FIFO input, may also be substantially reduced or eliminated by routing the clock signal with the data such that the clock signal is subjected to substantially the same delays as the data.

Figure 7:
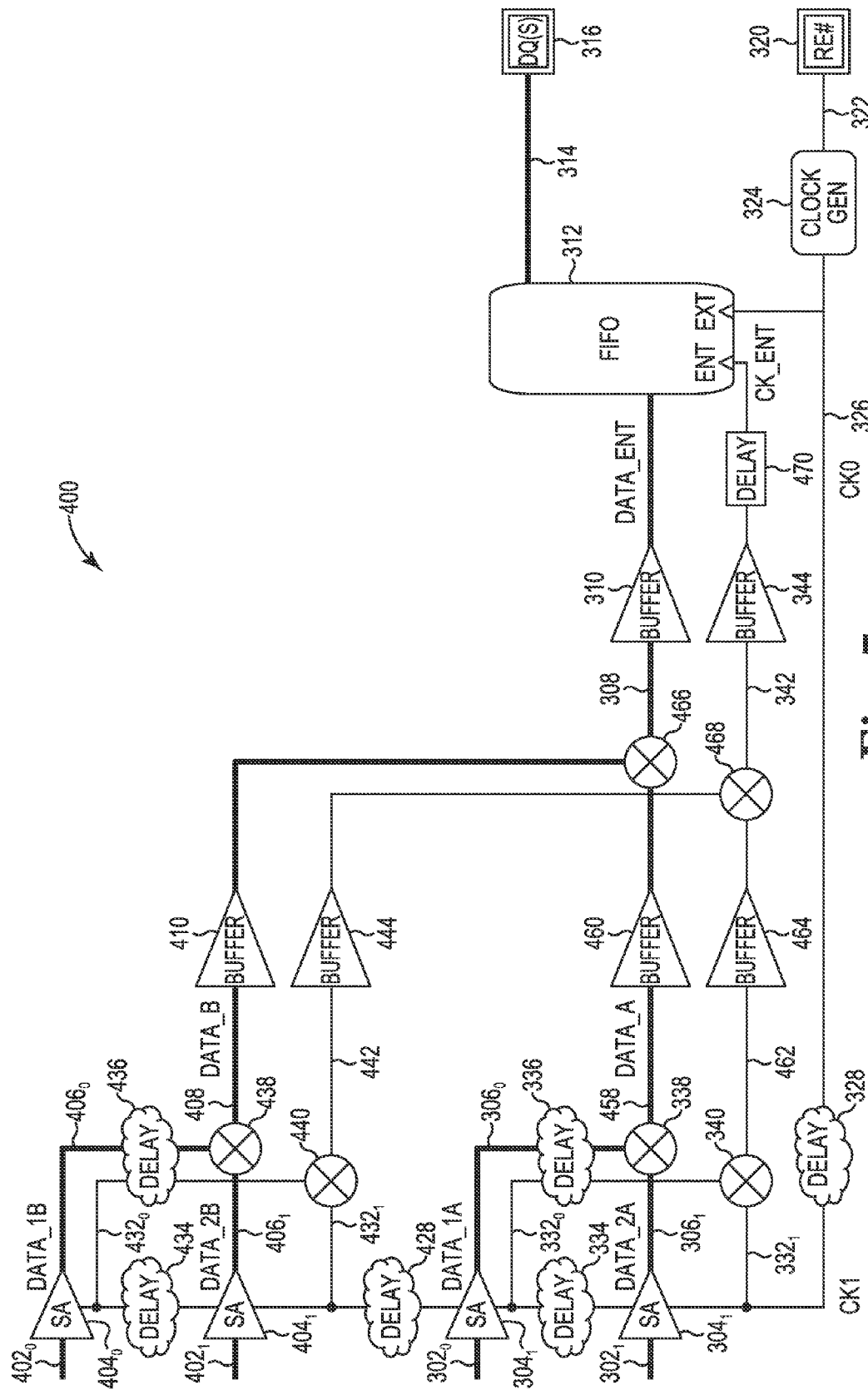
FIG. 7 is a schematic diagram illustrating another embodiment of a portion of an output data path.

FIG. 7 is a schematic diagram illustrating another embodiment of a portion of an output data path 400. In one example, portion of the output data path 400 is a portion of the memory device 100 previously described and illustrated with reference to FIG. 1. In contrast to the portion of the output data path 300 described with reference to FIG. 3, the portion of the output data path 400 includes multiple multiplexer levels rather than one multiplexer level.

As previously described and illustrated with reference to FIG. 3, the portion of the output data path 400 may include sense amplifiers $304_0$ and $304_1$, multiplexers 338 and 340, buffers 310 and 344, a FIFO 312, a clock generator 324, DQ(s) 316, and a RE# clock signal pad 320. In addition, portion of the output data path 400 may also include sense amplifiers $404_0$ and $404_1$, multiplexers 438 and 440, buffers 410, 444, 460, and 464, multiplexers 466 and 468, and a delay 470. The output of clock generator 324 is electrically coupled to the clock input of each sense amplifier $404_0$ and $404_1$ through clock signal path 326. The data input of each sense amplifier $404_0$ and $404_1$ is communicatively coupled to the cache register 118 (FIG. 1) through a data path $402_0$ and $402_1$, respectively. The data output of each sense amplifier $404_0$ and $404_1$ is communicatively coupled to an input of multiplexor 438 through a local data path $406_0$ and $406_1$, respectively. The output of multiplexor 438 is communicatively coupled to an input of multiplexer 466 through a midlevel data path 408. Midlevel data path 408 may include one or more buffers 410. The output of multiplexer 338 is communicatively coupled to an input of multiplexer 466 through a midlevel data path 458. Midlevel data path 458 may include one or more buffers 460.

Clock signal path 326 is electrically coupled to local return clock signal paths $432_0$ and $432_1$ at sense amplifiers $404_0$ and $404_1$, respectively. Each local return clock signal path $432_0$ and $432_1$ is electrically coupled to an input of multiplexer 440. The output of multiplexor 440 is electrically coupled to an input of multiplexer 468 through a midlevel return clock signal path 442. Midlevel return clock signal path 442 may include one or more buffers 444 corresponding to the one or more buffers 410 of midlevel data path 408. The output of multiplexor 340 is electrically coupled to an input of multiplexer 468 through a midlevel return clock signal path 462. Midlevel return clock signal path 462 may include one or more buffers 464 corresponding to the one or more buffers 460 of midlevel data path 458.

Multiplexer 338 passes a selected one of DATA_1A from sense amplifier $304_0$ on local data path $306_0$ or DATA_2A from sense amplifier $304_1$ on local data path $306_1$ to provide DATA_A on midlevel data path 458. Multiplexer 340 passes a selected one of a return clock signal on local return clock signal path $332_0$ from sense amplifier $304_0$ or a return clock signal on local return clock signal path $332_1$ from sense amplifier $304_1$ to provide the selected return clock signal on midlevel return clock signal path 462. Multiplexer 340 passes the return clock signal corresponding to the data passed by multiplexer 338. Thus, both the return clock signal and the data are subjected to substantially the same delay due to multiplexers 338 and 340. The midlevel return clock signal path 462 is routed along with the midlevel data path 458 such that both are subjected to substantially the same delay due to the routing and PVT variations.

In addition to delays 328 and 334 previously described and illustrated with reference to FIG. 3, clock signal path 326 may include a delay 428 due to the routing and PVT variations of clock signal path 326 between sense amplifiers $304_0$ and $404_1$. As such, the clock signal at the clock input of sense amplifier $304_0$ may be delayed to provide a delayed clock signal at the clock input of sense amplifier $404_1$. The clock signal path 326 may include an additional delay 434 due to the routing and PVT variations of clock signal path 326 between sense amplifier $404_1$ and sense amplifier $404_0$. As such, the clock signal may be further delayed between sense amplifier $404_1$ and sense amplifier $404_0$.

Each local return clock signal path $432_0$ and $432_1$ is routed along with its corresponding local data path $406_0$ and $406_1$ such that both are subjected to substantially the same delay due to the routing and PVT variations. For example, local return clock signal path $432_0$ and local data path $406_0$ may include a delay 436 due to the routing and PVT variations of local return clock signal path $432_0$ and local data path $406_0$, respectively.

Each sense amplifier $404_0$ and $404_1$ provides DATA_1B and DATA_2B on local data paths $406_0$ and $406_1$, respectively, in response to the clock signal on clock signal path 326. Multiplexer 438 passes a selected one of DATA_1B from sense amplifier $404_0$ on local data path $406_0$ or DATA_2B from sense amplifier $404_1$ on local data path $406_1$ to provide DATA_B on midlevel data path 408. Multiplexer 440 passes a selected one of a return clock signal on local return clock signal path $432_0$ from sense amplifier $404_0$ or a return clock signal on local return clock signal path $432_1$ from sense amplifier $404_1$ to provide the selected return clock signal on midlevel return clock signal path 442. Multiplexer 440 passes the return clock signal corresponding to the data passed by multiplexer 438. Thus, both the return clock signal and the data are subjected to substantially the same delay due to multiplexers 438 and 440. The midlevel return clock signal path 442 is routed along with the midlevel data path 408 such that both are subjected to substantially the same delay due to the routing and PVT variations.

Multiplexer 466 passes a selected one of DATA_A from multiplexer 338 on midlevel data path 458 or DATA_B from multiplexer 438 on midlevel data path 408 to provide DATA_ENT on global data path 308 at the data input of FIFO 312. Multiplexer 468 passes a selected one of a return clock signal on midlevel return clock signal path 462 from multiplexer 340 or a return clock signal on midlevel return clock signal path 442 from multiplexer 440 to provide the selected return clock signal on global return clock signal path 342. Multiplexer 468 passes the return clock signal corresponding to the data passed by multiplexer 466. Delay 470 on global return clock signal path 342 delays the return clock signal to provide CK_ENT at the ENT input of FIFO 312. Delay 470 sets the setup time for latching the data into FIFO 312 when using the rising edge of CK_ENT to trigger the latching of DATA_ENT into FIFO 312.

Figure 8:
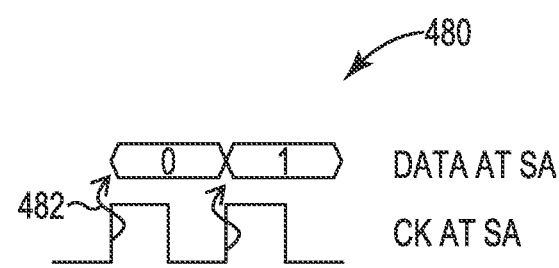
FIG. 8 is a timing diagram illustrating one embodiment of the triggering of data out of a sense amplifier of the output data path described with reference to FIG. 7.

FIG. 8 is a timing diagram 480 illustrating one embodiment of the triggering of data out of a sense amplifier of the portion of the output data path 400 described with reference to FIG. 7. Timing diagram 480 illustrates the data at a sense amplifier, such as sense amplifier $304_0$, $304_1$, $404_0$, or $404_1$, and the clock signal at the sense amplifier. As indicated at 482, the rising edge of the clock signal triggers the data out of the sense amplifier to provide the data on the respective local data path, such as local data path $306_0$, $306_1$, $406_0$, or $406_1$.

Figure 9:
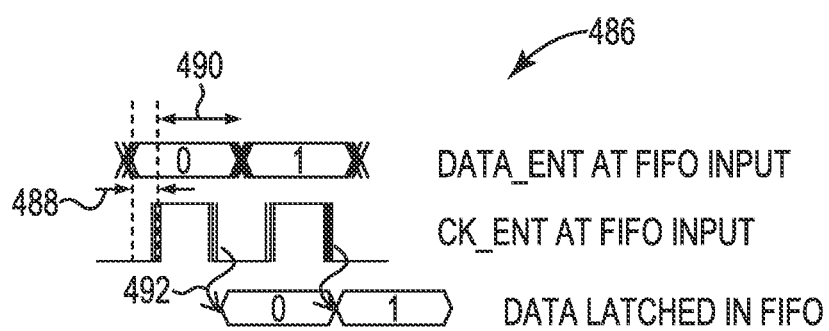
FIG. 9 is a timing diagram illustrating one embodiment of the latching of data into the FIFO of the output data path described with reference to FIG. 7.

FIG. 9 is a timing diagram 486 illustrating one embodiment of the latching of data into the FIFO 312 of the portion of the output data path 400 described with reference to FIG. 7. Timing diagram 486 illustrates the DATA_ENT at the input of FIFO 312, the clock signal CK_ENT at the ENT input of FIFO 312, and the data latched in FIFO 312. The setup margin for the DATA_ENT at the input of FIFO 312 is indicated at 488. The setup margin is set by delay 470 (FIG. 7). The hold margin is indicated at 490. As indicated at 492, the rising edge of CK_ENT latches the DATA_ENT into FIFO 312.

Figure 10:
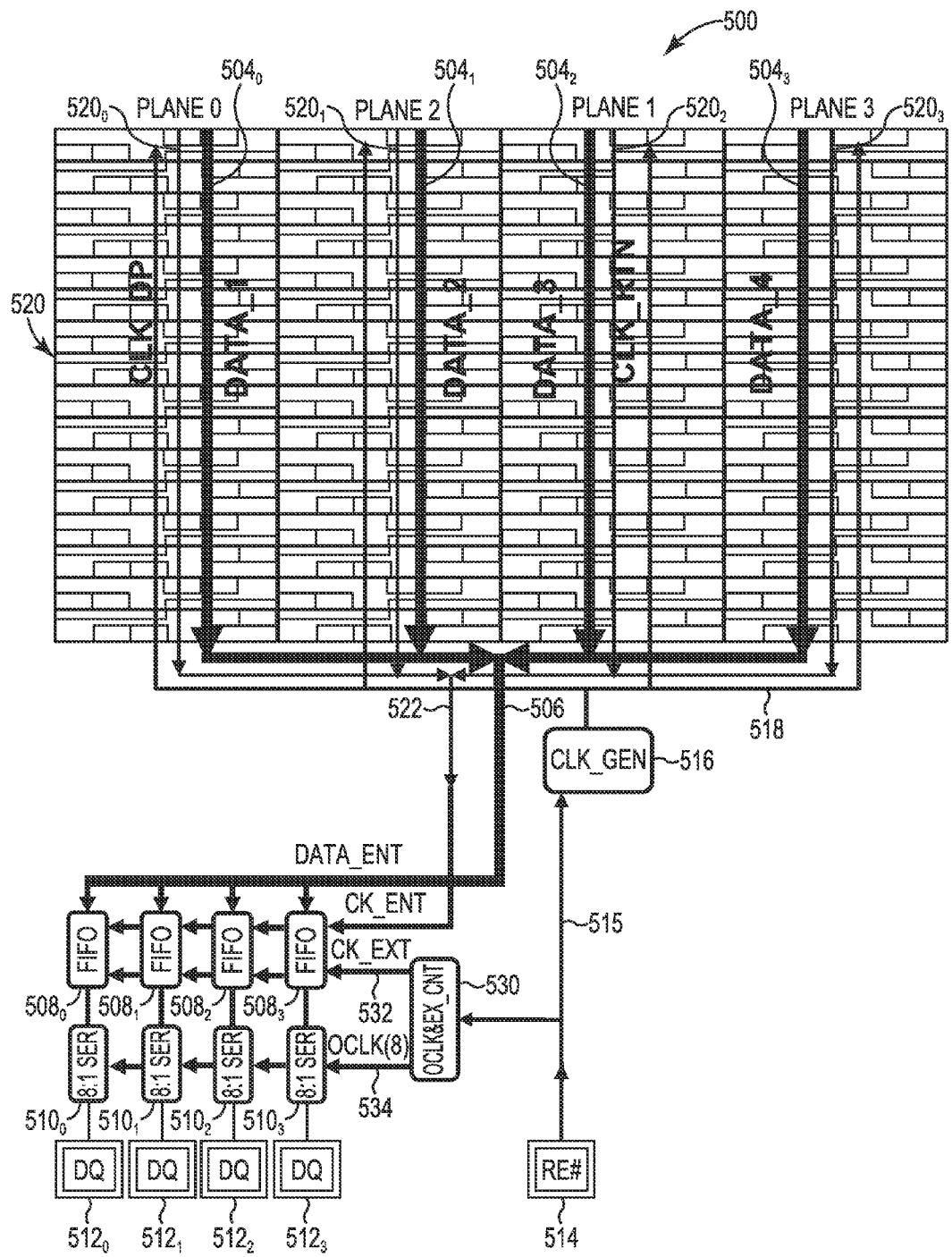
FIG. 10 is a schematic diagram illustrating one embodiment of an output data path of a memory.

FIG. 10 is a schematic diagram illustrating one embodiment of an output data path of a memory 500. Memory 500 includes an array of memory cells 502, FIFOs $508_0$ to $508_3$, serializers $510_0$ to $510_3$, data nodes (e.g., pads) DQs $512_0$ to $512_3$, a read enable RE# clock signal node (e.g., pad) 514, a clock generator 516, and an output clock and FIFO exit counter generator 530. RE# clock signal pad 514 is electrically coupled to an input of clock generator 516 and an input of output clock and FIFO exit counter generator 530 through a signal path 515. An output of clock generator 516 is electrically coupled to the clock input of sense amplifiers (not shown) through a clock signal path 518. One output of output clock and FIFO exit counter generator 530 is electrically coupled to the exit clock inputs of FIFOs $508_0$ to $508_3$ through a signal path 532. Another output of output clock and FIFO exit counter generator 530 is electrically coupled to and the clock inputs of serializers $510_0$ to $510_3$ through a signal path 534.

Array of memory cells 502 is divided into four planes as indicated by PLANE 0, PLANE 2, PLANE 1, and PLANE 3. Each plane includes sense amplifiers (not shown), clock signal path 518, a local data path $504_0$ to $504_3$, and a local return clock signal path $520_0$ to $520_3$, respectively. Each output data path $504_0$ to $504_3$ and each local return clock signal path $520_0$ to $520_3$ is communicatively coupled to a global data path 506 and a global return clock signal path 522 via multiplexers (not shown), respectively. Global data path 506 is communicatively coupled to the data input of FIFOs $508_0$ to $508_3$. The global return clock signal path 522 is electrically coupled to the entrance clock input of each FIFO $508_0$ to $508_3$. The data output of each FIFO $508_0$ to $508_3$ is communicatively coupled to the data input of each serializer $510_0$ to $510_3$. The data output of each serializer $510_0$ to $510_3$ is communicatively coupled to a DQ $512_0$ to $512_3$, respectively.

Clock generator 516 receives the RE# clock signal and generates the CLK_DP signal on clock signal path 518. In this example, clock generator 516 reduces the clock rate of the RE# clock signal by four to provide the CLK_DP signal. The CLK_DP signal points to the next data (e.g., DATA_1, DATA_2, DATA_3, or DATA_4) to be latched by FIFOs $508_0$ to $508_3$. Output clock and FIFO exit counter generator 530 receives the RE# clock signal and generates the CK_EXT signal on signal path 532 and the OCLK(8) signal on signal path 534. The CK_EXT signal points to the output address of FIFOs $508_0$ to $508_3$ of the next output data. In this example, output clock and FIFO exit counter generator 530 reduces the clock rate of the RE# clock signal by four to provide the CK_ENT signal. In one example, output clock and FIFO exit counter generator 530 doubles the clock rate of the RE# clock signal to provide the OCLK(8) signal to output the data to DQs $512_0$ to $512_3$ on both edges of the RE# clock signal for a DDR memory.

Each local return clock signal path $520_0$ to $520_3$ is routed along with its corresponding local data path $504_0$ to $504_3$ such that both are subjected to substantially the same delay due to the routing and PVT variations. In this example, each local data path $504_0$ to $504_3$ includes 32 parallel data lines such that each of DATA_1, DATA_2, DATA_3, and DATA_4 includes 32 bits. DATA_ENT on global data path 506 is a selected one of DATA_1, DATA_2, DATA_3, and DATA_4. Each FIFO $508_0$ to $508_3$ latches eight bits of DATA_ENT on eight parallel data lines in response to the CK_ENT signal. Each FIFO $508_0$ to $508_3$ provides eight bits on eight parallel data lines to each serializer $510_0$ to $510_3$ in response to the CK_EXT signal. Each serializer $510_0$ to $510_3$ serializes the eight parallel data bits to serially output the eight bits on each DQ $512_0$ to $512_3$, respectively, in response to the OCLK(8) signal.

Figure 11:
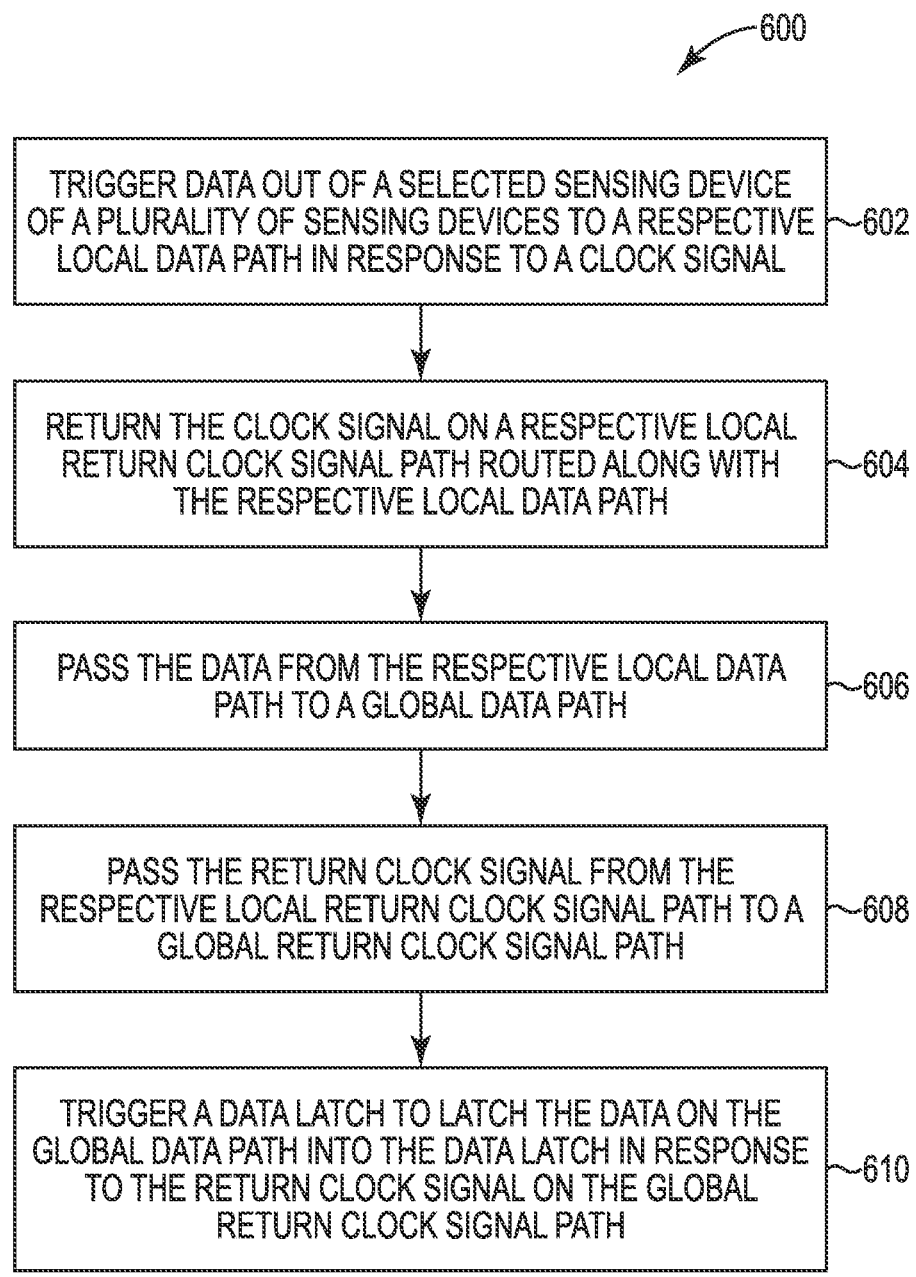
FIG. 11 is a flow diagram illustrating one embodiment of a method for clock-data tracking.

FIG. 11 is a flow diagram illustrating one embodiment of a method 600 for clock-data tracking. At 602, data is triggered out of a selected sensing device of a plurality of sensing devices to a respective local data path in response to a clock signal. At 604, the clock signal is returned on a respective local return clock signal path routed along with the respective local data path. At 606, the data is passed from the respective local data path to a global data path. At 608, the return clock signal is passed from the respective local return clock signal path to a global return clock signal path. At 610, a data latch is triggered to latch the data on the global data path into the data latch in response to the return clock signal on the global return clock signal path.

Method 600 may also include triggering the data latch to output data to a data node in response to the clock signal. In one example, triggering data out of the selected sensing device includes triggering data out of the selected sensing device in response to a rising edge of the clock signal, and triggering the data latch to latch the data into the data latch includes triggering the data latch to latch the data into the data latch in response to a falling edge of the return clock signal. Method 600 may further include buffering the data on the global data path and buffering the return clock signal on the global return clock signal path such that a delay of the return clock signal due to the return clock signal buffering substantially equals a delay of the data due to the data buffering. In one example, method 600 further includes generating the clock signal based on a read enable signal. In one example, the data is parallel data and method 600 further includes triggering the data latch to output parallel data in response to the clock signal and serializing the parallel data output by the data latch to pass the serialized data to a data node.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A system comprising:
    a plurality of sensing devices to sense data from an array of memory cells, each sensing device of the plurality of sensing devices to output data onto a respective local data path in response to a clock signal on a clock signal path;
    a first multiplexor to pass data from a selected local data path to a global data path;
    a plurality of local return clock signal paths, each local return clock signal path of the plurality of local return clock signal paths coupled to the clock signal path at a respective sensing device such that each local return clock signal path of the plurality of local return clock signal paths is routed along with a respective local data path;
    a second multiplexor to pass a return clock signal from a selected local return clock signal path corresponding to the selected local data path to a global return clock signal path; and
    a data latch to latch the data on the global data path into the data latch in response to the return clock signal on the global return clock signal path.

2. The system of claim 1, wherein a selected sensing device is to output data in response to a rising edge of the clock signal on the clock signal path, and
    wherein the data latch is to latch data on the global data path into the data latch in response to a falling edge of the return clock signal on the global return clock signal path.

3. The system of claim 1, further comprising:
    a delay on the global return clock signal path to delay the return clock signal,
    wherein a selected sensing device is to output data in response to a rising edge of the clock signal on the clock signal path, and
    wherein the data latch is to latch data on the global data path into the data latch in response to a rising edge of the delayed return clock signal on the global return clock signal path.

4. The system of claim 1, wherein the first multiplexor is to pass data from the selected local data path to a midlevel data path, and wherein the second multiplexor is to pass the return clock signal from the selected local return clock signal path to a midlevel return clock signal path, the system further comprising:
    a third multiplexor to pass data from the midlevel data path to the global data path; and a fourth multiplexor to pass the return clock signal from the midlevel return clock signal path to the global return clock signal path.

5. The system of claim 1, wherein the data latch outputs data to a data node in response to a rising edge of the clock signal on the clock signal path.

6. The system of claim 1, further comprising:
a clock generator to receive a read enable signal and to generate the clock signal based on the read enable signal.

7. The system of claim 1, wherein a data delay due to a routing of each local data path is substantially equal to a return clock signal delay due to a routing of a respective local return clock signal path.

8. The system of claim 1, wherein a data delay due to the first multiplexor is substantially equal to a return clock signal delay due to the second multiplexor.

9. The system of claim 1, wherein a data delay due to the global data path is substantially equal to a return clock signal delay due to the global return clock signal path.

10. A memory comprising:
a plurality of sensing devices coupled to an array of memory cells;
a plurality of local data paths, each local data path of the plurality of local data paths coupled to an output of a respective sensing device;
a first multiplexor coupled between the plurality of local data paths and a global data path;
a clock signal path coupled to each sensing device of the plurality of sensing devices;
a plurality of local return clock signal paths, each local return clock signal path of the plurality of local return clock signal paths coupled to the clock signal path at a respective sensing device;
a second multiplexor coupled between the plurality of local return clock signal paths and a global return clock signal path; and
a data latch coupled to the global data path and the global return clock signal path.

11. A memory comprising:
a plurality of sensing devices coupled to an array of memory cells;
a plurality of local data paths, each local data path of the plurality of local data paths coupled to a respective sensing device,
a first multiplexor coupled between the plurality of local data paths and a global data path;
a clock signal path coupled to each sensing device of the plurality of sensing devices;
a plurality of local return clock signal paths, each local return clock signal path of the plurality of local return clock signal paths coupled to the clock signal path at a respective sensing device,
a second multiplexor coupled between the plurality of local return clock signal paths and a global return clock signal path;
a data latch coupled to the global data path and the global return clock signal path;
a third multiplexor coupled between the first multiplexor and the global data path; and
a fourth multiplexor coupled between the second multiplexor and the global return clock signal path.

12. The memory of claim 10, further comprising:
a clock generator coupled between a read enable signal node and the clock signal path to generate a clock signal based on a read enable signal on the read enable signal node.

13. The memory of claim 10, wherein the clock signal path is coupled to the data latch to trigger data out of the data latch to a data node.

14. The memory of claim 10, further comprising:
a buffer along the global data path; and
a buffer along the clock signal path corresponding to the buffer along the global data path.

15. The memory of claim 10, wherein a return clock signal delay due to the routing of each local return clock signal path of the plurality of local return clock signal paths substantially equals a data delay due to the routing of a respective local data path.

16. The memory of claim 10, wherein a return clock signal delay due to the routing of the global return clock signal path substantially equals a data delay due to the routing of the global data path.

17. The memory of claim 10, wherein the array of memory cells comprises a NAND array of memory cells.

18. A method comprising:
triggering data out of a selected sensing device of a plurality of sensing devices to a respective local data path in response to a clock signal;
returning the clock signal on a respective local return clock signal path routed along with the respective local data path;
passing the data from the respective local data path to a global data path;
passing the return clock signal from the respective local return clock signal path to a global return clock signal path; and
triggering a data latch to latch the data on the global data path into the data latch in response to the return clock signal on the global return clock signal path.

19. The method of claim 18, further comprising:
triggering the data latch to output data to a data node in response to the clock signal.

20. The method of claim 18, wherein triggering data out of the selected sensing device comprises triggering data out of the selected sensing device in response to a rising edge of the clock signal, and
wherein triggering the data latch to latch the data into the data latch comprises triggering the data latch to latch the data into the data latch in response to a falling edge of the return clock signal.

21. The method of claim 18, further comprising:
buffering the data on the global data path; and
buffering the return clock signal on the global return clock signal path such that a delay of the return clock signal due to the return clock signal buffering substantially equals a delay of the data due to the data buffering.

22. The method of claim 18, further comprising:
generating the clock signal based on a read enable signal.

23. The method of claim 18, wherein the data is parallel data, the method further comprising:
triggering the data latch to output parallel data in response to the clock signal; and
serializing the parallel data output by the data latch to pass the serialized data to a data node.

* * * * *